United States Patent
Gocke et al.

(10) Patent No.: US 11,578,526 B2
(45) Date of Patent: Feb. 14, 2023

(54) CONTROL DEVICE FOR A VEHICLE HAVING AN AUTOMATICALLY OPENING AND/OR AUTOMATICALLY CLOSING PANEL

(71) Applicant: Bayerische Motoren Werke Aktiengesellschaft, Munich (DE)

(72) Inventors: Tim Gocke, Munich (DE); Lisa Rottner, Unterhaching (DE); Michael Thomas, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 795 days.

(21) Appl. No.: 16/534,490

(22) Filed: Aug. 7, 2019

(65) Prior Publication Data
US 2019/0360257 A1 Nov. 28, 2019

Related U.S. Application Data

(63) Continuation of application No. PCT/EP2018/062416, filed on May 14, 2018.

(30) Foreign Application Priority Data

May 16, 2017 (DE) ..................... 10 2017 208 221.6

(51) Int. Cl.
E05F 15/73 (2015.01)
B60R 16/023 (2006.01)
G05B 19/4155 (2006.01)

(52) U.S. Cl.
CPC .......... E05F 15/73 (2015.01); B60R 16/0237 (2013.01); G05B 19/4155 (2013.01);
(Continued)

(58) Field of Classification Search
CPC . E05F 15/73; B60R 16/0237; G05B 19/4155; G05B 2219/43071; E05Y 2900/546
(Continued)

(56) References Cited

U.S. PATENT DOCUMENTS 6,377,009 B1 * 4/2002 Philipp .................... E05F 15/46
318/266
9,354,035 B2 * 5/2016 Sieg .......................... G01B 7/14
(Continued)

FOREIGN PATENT DOCUMENTS

CN 101883906 A 11/2010
CN 104136697 A 11/2014
(Continued)

OTHER PUBLICATIONS

English translation of Chinese Office Action issued in Chinese Application No. 20188001337.7 dated May 27, 2020 (seven (7) pages).
(Continued)

Primary Examiner — David Luo
(74) Attorney, Agent, or Firm — Crowell & Moring LLP

(57) ABSTRACT

A control device relates to a vehicle having an automatically opening and/or automatically closing lid with at least one control switch in the vicinity of the lid and with a programmable electronic control unit. The control switch may be operated arbitrarily contactlessly in the form of a proximity sensor and when operated generates an operation request signal which is an input signal to the control unit. The control unit is configured in such a manner that defined environmental conditions may be evaluated for the detection of a risk of salinity and humidity and that, given the presence of a risk of salt and water, an appropriate adaptation may be made to the evaluation of the operation request signal. Preferably, at least one outside temperature below a pre-
(Continued)

defined threshold and information indicating the presence of moisture are defined as the environmental conditions to be evaluated for detecting the risk of salt and water.

6 Claims, 1 Drawing Sheet

(52) U.S. Cl.
CPC .................. *E05Y 2900/546* (2013.01); *G05B 2219/43071* (2013.01)

(58) Field of Classification Search
USPC ........................................ 318/558, 3; 701/49
See application file for complete search history.

(56) References Cited

U.S. PATENT DOCUMENTS

| | | | |
|---|---|---|---|
| 9,593,932 B2* | 3/2017 | Sieg | ........................ G01V 13/00 |
| 2010/0264940 A1 | 10/2010 | Tsuchida et al. | |
| 2013/0194069 A1 | 8/2013 | Baudru et al. | |
| 2015/0091311 A1 | 4/2015 | Witte et al. | |
| 2015/0134208 A1 | 5/2015 | Gunreben | |
| 2015/0345205 A1 | 12/2015 | Gunreben et al. | |

FOREIGN PATENT DOCUMENTS

| | | |
|---|---|---|
| CN | 204941104 U | 1/2016 |
| DE | 10 2010 038 705 A1 | 2/2012 |
| DE | 10 2012 008 530 A1 | 11/2013 |
| DE | 10 2012 013 065 A1 | 1/2014 |
| DE | 10 2012 107 284 A1 | 2/2014 |
| DE | 10 2012 110 383 A1 | 4/2014 |

OTHER PUBLICATIONS

International Search Report (PCT/ISA/210) issued in PCT Application No. PCT/EP2018/062416 dated Aug. 31, 2018 with English translation (five pages).

German-language Written Opinion (PCT/ISA/237) issued in PCT Application No. PCT/EP2018/062416 dated Aug. 31, 2018 (six pages).

German-language Search Report issued in counterpart German Application No. 10 2017 208 221.6 dated Nov. 17, 2017 with partial English translation (12 pages).

* cited by examiner

CONTROL DEVICE FOR A VEHICLE HAVING AN AUTOMATICALLY OPENING AND/OR AUTOMATICALLY CLOSING PANEL

CROSS REFERENCE TO RELATED APPLICATIONS

This application is a continuation of PCT International Application No. PCT/EP2018/062416, filed May 14, 2018, which claims priority under 35 U.S.C. § 119 from German Patent Application No. 10 2017 208 221.6, filed May 16, 2017, the entire disclosures of which are herein expressly incorporated by reference.

BACKGROUND AND SUMMARY OF THE INVENTION

The invention relates to a control device for a vehicle having an automatically opening and/or automatically closing lid.

Such a control device is known from DE 10 2010 038 705 A1, for example. This control device relates to a vehicle having an automatically opening and/or automatically closing lid, having at least one operating switch close to the lid, having a programmable electronic controller and having an apparatus for monitoring the pivot range space when the lid is open. In this case, the operating switch can be operated arbitrarily contactlessly in the form of a proximity sensor and, when it has been operated, an operator request signal is gene-rated that is an input signal for the controller. The apparatus for monitoring the pivot range space likewise interacts with the controller via a data connection. The controller is configured (in particular programmed) such that the presence of the operator request signal when the lid is open prompts it to output a pivot command to a closing mechanism to close the lid only if the apparatus for monitoring the pivot range space does not detect the presence of an obstacle.

Furthermore, such a control device is in production with the current vehicle range from the Applicant and is also referred to as a "smart opener" system (SMO system).

The invention is based on the object of developing a control device for automatically closing a lid in regard to its functional safety.

The control device according to the invention relates to a vehicle having an automatically opening and/or automatically closing lid having at least one operating switch close to the lid and having a programmable electronic controller, wherein the operating switch can be operated arbitrarily contactlessly in the form of a proximity sensor and, when it has been operated, generates an operator request signal that is an input signal for the controller. The controller is configured (in particular by an appropriately programmed functional module) such that defined environmental conditions are evaluable to detect a risk of salt and moisture and that, if there is a risk of salt and moisture, an applicable adaptation for evaluation of the operator request signal is performable. Preferably, the environmental conditions to be evaluated that are defined for detection of a risk of salt and moisture are at least the outside temperature below a prescribed threshold and information describing the presence of wetness.

In this case, the environmental conditions can be detected both by the vehicle's own sensor system and by an online database or by other external information sources for the SMO system.

The invention is based on the following insights.

To implement what is known as the "smart opener" function (trunk lid opens contactlessly when the foot is kicked beneath the central tail region) in vehicles from the Applicant, two sensors (round conductor and flat conductor) are used. Both sensors are in the rear bumper of the vehicle. The lower round conductor is situated in unprotected fashion in a potential spray region. A distinction between valid kick detection and unwanted tailgate opening is meant to be safely possible.

In the driving mode in winter conditions, in particular the lower sensor can become wet with a salt crust. The upper sensor is less affected by this salt wetting. A moisture salt crust increases the capacitive property and hence the sensitivity of the round conductor. Moistening of the salt crust on the lower round conductor can reproducibly lead to walking past not being able to be explicitly distinguished from conscious kicking. A dried salt crust alone does not normally bring about such a response. A completely dry and cleaned or new vehicle is likewise inconspicuous.

A mechanical solution option would be a shield for at least the lower sensor as protection against salt and wetting by water. To save costs and the sophistication of a protective apparatus of this kind, however, the following electronic function is proposed according to the invention as a solution to the problem.

On the basis of defined environmental conditions, in particular climate data (e.g. outside temperature, precipitation) and preferably additionally the use of the windshield wiper function and/or the switched-on state of a carwash mode, the parameter set of the sensor is adapted for detection of kicking. The "smart opener" or the parameter set for detection of kicking can also be matched to the environmental conditions by an online remote update ("Adaptive Connection Functions"). During the adaptation, the sensitivity of the sensor is reduced in particular for a winter mode, that is to say if a risk of salt and moisture is detected.

This prevents false triggerings of the smart opener function by people walking past the vehicle in winter after increased salt use and moisture. At the same time, a very good level of functional safety for the smart opener functionality can be achieved in summer months without the sensor system being wetted with salt if, for a summer mode, the sensitivity is possibly even increased in comparison with an all-year mode (according to the prior art).

Other objects, advantages and novel features of the present invention will become apparent from the following detailed description of one or more preferred embodiments when considered in conjunction with the accompanying drawings.

BRIEF DESCRIPTION OF THE DRAWINGS

The single

DETAILED DESCRIPTION OF THE DRAWINGS

Figure 1:
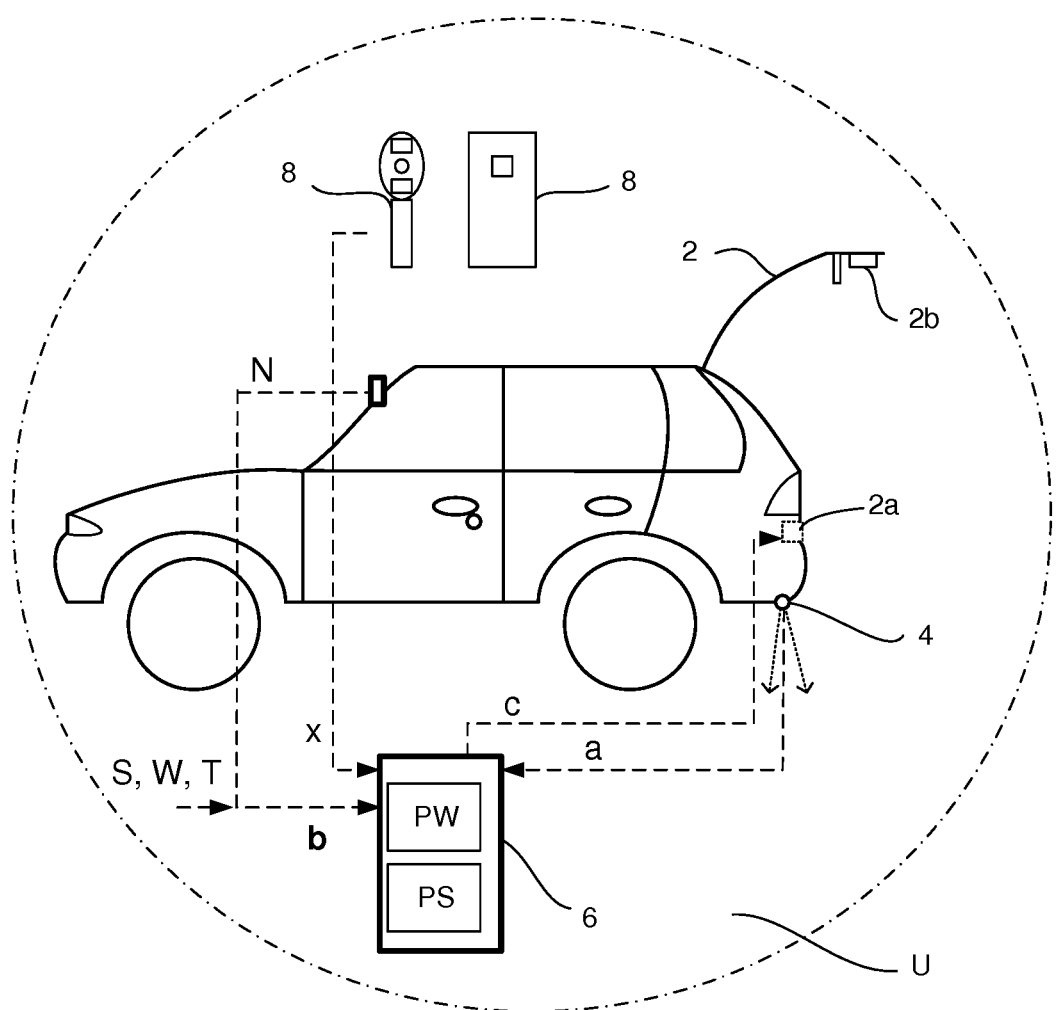
FIG. 1 depicts an exemplary embodiment of the invention in a schematic depiction of a motor vehicle that has a lid automatically opening and/or closing on the basis of a pivot command (open command or close command).

In the exemplary embodiment shown in FIG. 1, the lid 2 is in the form of a tailgate of a motor vehicle. A lid 2 could also be a door, a hood or a gas cap, for example.

The automatic opening of the lid 2 is initiated from a closed state of the tailgate 2 by an open command in the form of a control signal c of a programmable controller 6 to a locking and unlocking mechanism 2a, 2b. The tailgate 2 is then transferred to an open position either on the basis of a spring pretension or on the basis of an activated (e.g. electrical, hydraulic or pneumatic) motor system. Preferably, the lid 2 is automatically opened over its entire opening path or as far as a maximum permitted opening path in this case.

Further, the motor vehicle includes at least one, preferably two, proximity sensor(s) 4 operatively connected to the controller 6. The text below refers to only one proximity sensor 4 to simplify matters. The proximity sensor 4 is an operating switch that can be operated contactlessly in arbitrary fashion. When it is operated, it generates an operator request signal a that is routed as an input signal to the controller 6. The proximity sensor 4 depicted here can be the aforementioned lower round conductor sensor, for example.

The controller 6 and the proximity sensor 4 are either separately programmable interacting modules or are integrated in a single electronic programmable module. The invention can be contained in each module in the form of a program or in the form of program parts. Preferably, separate modules are used, wherein a comparatively simple electronic module that, in the active state, consumes as little electric power as possible and receives the signals necessary for the invention from the controller 6 is used for the proximity sensor 4.

The controller 6 is preferably designed such that not only the presence of the operator request signal a is monitored, but also further stipulated conditions, before it outputs a control signal c—in this case to open the tailgate. One such further stipulated condition is for example the additional presence of a defined vehicle state signal x that allows for example unauthorized vehicle startup to be precluded. Such a state signal x can be, for example, an unlocked state signal of the central locking system or a detection signal concerning the presence of an access authorization means 8 in the locked state. For the second alternative, a check is performed, for example by involving the controller 6, to ascertain whether there is an access authorization means (normally a user carrying a radio key or a keycard) within a prescribed region U around the vehicle. Such monitoring means are already known.

The at least one proximity sensor 4 is preferably arranged such that a user can prompt it to switch, or can switch it, by waving his foot in the region between the vehicle body and the road surface. In particular, the proximity sensor 4 is arranged beneath a bumper or on the underside of a bumper in a manner integrated therein.

If a defined operator request signal a and, preferably, additionally the signal x are present in the controller 6, the controller 6 outputs the control signal c to activate the unlocking/locking mechanism 2a, 2b to release the automatically opening lid 2.

The inventive configuration of the control device is discussed more specifically below.

According to an embodiment of the invention, for example a line b is connected to an input of the controller 6 in this case. The line b can transmit an analog or a digital sensor signal or a data bus signal containing multiple pieces of environmental condition information. The line b is used to detect defined environmental conditions. On the basis of defined environmental conditions, in particular climate data (e.g. outside temperature T, precipitation N) and preferably additionally the use of the windshield wiper function (S) and/or the switched-on state (W) of a carwash mode, the parameter set of the proximity sensor 4 is adapted for detection of kicking. In particular, the parameter set influences the interpretation of the sensor signal or operator request signal a.

In the exemplary embodiment depicted, the controller 6 can be connected for example to an applicable sensor on the windshield via the line b, said sensor outputting a precipitation signal N as an environmental condition. Furthermore, the controller 6 can use the line b to evaluate information about defined environmental conditions from further controllers; e.g. from a climate controller (for outside temperature T and humidity), from a traction controller (for a risk of hard-packed snow), from a windshield wiper controller (for precipitation detection S) and/or from a transmission controller (for carwash mode detection W).

It is thus possible, in particular as a result of the choice of the parameter sets of the proximity sensor 4, for at least two kick detection modes (e.g. one "winter" and one "summer") to be kept and for, in each case, one mode therefrom to be in each case automatically activated (by onboard or online remote parameter data) by the evaluation of the defined environmental conditions N, S, W and/or T. In particular, for example, the parameter set PW is provided for a "winter detection mode" and activated if the outside temperature T drops below a prescribed frost threshold (e.g. 3° C.) and at the same time wetness is detected by way of a rain sensor signal N, by way of the windshield wiper switched-on status S and/or by way of the activated carwash mode W. Otherwise, the parameter set is provided and activated for a "summer detection mode" PS.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A control device for a vehicle having an automatically opening and/or automatically closing lid and having at least one operating switch arranged in the vicinity of the lid, comprising:
    a programmable electronic controller, wherein
    the operating switch is operable arbitrarily contactlessly in a form of a proximity sensor,
    when the operating switch has been operated, an operator request signal is generated that is an input signal for the controller, and
    the controller is configured such that:
        defined environmental conditions are evaluable to detect a risk of salt and moisture, and
        if there is a risk of salt and moisture, an appropriate adaptation is performed for evaluation of the operator request signal,
    wherein the environmental conditions to be evaluated that are defined for detection of the risk of salt and moisture are at least an outside temperature below a prescribed threshold and information describing presence of wetness.

2. The control device according to claim 1, wherein
the information describing the presence of wetness that is defined is a detection of a switched-on windshield wiper.

3. The control device according to claim 1, wherein
the information describing the presence of wetness that is defined is a detection of a carwash mode.

4. The control device according to claim 1, wherein
the adaptation for evaluation of the operator request signal is performable in the form of a selection of a specific parameter set for the proximity sensor.

5. A control device for a vehicle having an automatically opening and/or automatically closing lid and having at least one operating switch arranged in the vicinity of the lid, comprising:
a programmable electronic controller, wherein
the operating switch is operable arbitrarily contactlessly in a form of a proximity sensor,
when the operating switch has been operated, an operator request signal is generated that is an input signal for the controller, and
the controller is configured such that:
defined environmental conditions are evaluable to detect a risk of salt and moisture, and
if there is a risk of salt and moisture, an appropriate adaptation is performed for evaluation of the operator request signal,
wherein at least two modes are provided having parameter sets respectively associated therewith for the proximity sensor,
wherein the two modes are automatically selectable on the basis of the evaluation of the defined environmental conditions, wherein the parameter sets are stored in the controller or are each loaded into the controller by a remote transmission as required.

6. A control device for a vehicle having an automatically opening and/or automatically closing lid and having at least one operating switch arranged in the vicinity of the lid, comprising:
a programmable electronic controller, wherein
the operating switch is operable arbitrarily contactlessly in a form of a proximity sensor,
when the operating switch has been operated, an operator request signal is generated that is an input signal for the controller, and
the controller is configured such that:
defined environmental conditions are evaluable to detect a risk of salt and moisture, and
if there is a risk of salt and moisture, an appropriate adaptation is performed for evaluation of the operator request signal,
wherein the adaptation for evaluation of the operator request signal in the event of a detected risk of salt and moisture is performed in the form of reduction of sensitivity of the proximity sensor.

\* \* \* \* \*